United States Patent
Takemura

(10) Patent No.: US 9,704,886 B2
(45) Date of Patent: Jul. 11, 2017

(54) SIGNAL PROCESSING DEVICE

(71) Applicant: SEMICONDUCTOR ENERGY LABORATORY CO., LTD., Atsugi-shi, Kanagawa-ken (JP)

(72) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 207 days.

(21) Appl. No.: 14/272,824

(22) Filed: May 8, 2014

(65) Prior Publication Data
US 2014/0339540 A1 Nov. 20, 2014

(30) Foreign Application Priority Data
May 16, 2013 (JP) .................................. 2013-104129

(51) Int. Cl.
*H03K 19/094* (2006.01)
*H01L 27/12* (2006.01)
*H03K 19/173* (2006.01)

(52) U.S. Cl.
CPC ..... *H01L 27/1225* (2013.01); *H03K 19/1737* (2013.01)

(58) Field of Classification Search
CPC .................................. H03K 19/1735–19/1737
USPC ................................................ 326/112–113
See application file for complete search history.

(56) References Cited

U.S. PATENT DOCUMENTS

| | | | |
|---|---|---|---|
| 7,064,973 B2 | 6/2006 | Peng et al. | |
| 8,476,927 B2 * | 7/2013 | Nishijima | H03K 19/17728 326/38 |
| 8,547,753 B2 | 10/2013 | Takemura et al. | |
| 9,106,223 B2 * | 8/2015 | Takemura | H03K 19/01858 |
| 2011/0175646 A1 | 7/2011 | Takemura et al. | |
| 2011/0228584 A1 | 9/2011 | Takemura | |
| 2011/0249484 A1 | 10/2011 | Takemura | |
| 2012/0025191 A1 | 2/2012 | Yamazaki | |
| 2012/0212995 A1 | 8/2012 | Kurokawa | |
| 2012/0243336 A1 | 9/2012 | Nishi et al. | |
| 2012/0274355 A1 | 11/2012 | Nishijima | |
| 2012/0293200 A1 | 11/2012 | Takemura | |
| 2012/0293202 A1 | 11/2012 | Nishijima et al. | |
| 2012/0293206 A1 | 11/2012 | Yoneda et al. | |
| 2012/0293209 A1 | 11/2012 | Takewaki | |

* cited by examiner

*Primary Examiner* — Jason M Crawford
(74) *Attorney, Agent, or Firm* — Fish & Richardson P.C.

(57) ABSTRACT

A plurality of writing transistors are connected in series, and a gate of a pass transistor, an input terminal of an inverter, or the like is directly or indirectly connected to each connection portion of the writing transistors. For example, a signal processing device includes first to third pass transistors, one semiconductor layer, and first to third wirings that overlap with the semiconductor layer and do not overlap with each other. Potentials of the first to third wirings can each change conductivities of at least portions of the semiconductor layer that overlap with the respective wirings. Gates of the first to third pass transistors are electrically connected to the semiconductor layer and are brought into a floating state depending on the conductivities of the portions of the semiconductor layer. Conduction between sources and drains of the pass transistors is controlled by potentials of the gates in the floating state.

15 Claims, 17 Drawing Sheets

SIGNAL PROCESSING DEVICE

BACKGROUND OF THE INVENTION

1. Field of the Invention

This disclosure relates to a signal processing device.

2. Description of the Related Art

For example, Patent Documents 1 to 3 disclose a signal processing device (a programmable logic device: PLD) that controls electrical connection between a pair of nodes through a source and a drain of a pass transistor. In the signal processing device, the potential of a gate of the pass transistor is kept by turning off a transistor that uses an oxide semiconductor or the like. The transistor including an oxide semiconductor or the like can have extremely high off-state resistance. Therefore, in the signal processing device, the on/off state of the pass transistor can be maintained for a long time.

REFERENCE

Patent Document

[Patent Document 1] U.S. Pat. No. 8,547,753
[Patent Document 2] United States Patent Application Publication No. 2012/0212995
[Patent Document 3] United States Patent Application Publication No. 2012/0293200

SUMMARY OF THE INVENTION

A signal processing device with a novel circuit configuration is provided.

A plurality of writing transistors are connected in series, and a gate of a pass transistor, an input terminal of an inverter, or the like is directly or indirectly connected to each connection portion of the writing transistors.

One embodiment is a signal processing device including first to third pass transistors, one semiconductor layer, and first to third wirings that overlap with the semiconductor layer. In the signal processing device, potentials of the first to third wirings can each change conductivities of at least portions of the semiconductor layer that overlap with the respective wirings. Gates of the first to third pass transistors are not electrically connected to anything other than the semiconductor layer and are brought into a floating state depending on the conductivities of the portions of the semiconductor layer. Conduction between sources and drains of the first to third pass transistors is controlled by potentials of the gates in the floating state of the respective first to third pass transistors.

In the above-described signal processing device, one of the source and the drain of the first pass transistor, one of the source and the drain of the second pass transistor, and one of the source and the drain of the third pass transistor may be directly or indirectly connected to a first input terminal, a second input terminal, and a third input terminal, respectively, of a multiplexer. In addition, a potential of the other of the source and the drain of the first pass transistor is always equal to a potential of the other of the source and the drain of the second pass transistor and a potential of the other of the source and the drain of the third pass transistor.

In the above-described signal processing device, a potential of part of the semiconductor layer is always equal to the potential of the other of the source and the drain of the first pass transistor, the potential of the other of the source and the drain of the second pass transistor, and the potential of the other of the source and the drain of the third pass transistor.

A simplified circuit configuration, high yield, and a high degree of integration can be achieved. Note that in addition to these effects, other effects to be described in detail below can be obtained.

DETAILED DESCRIPTION OF THE INVENTION

Hereinafter, embodiments of the present invention will be described in detail with reference to the accompanying drawings. Note that embodiments of the present invention are not limited to the following description, and it will be easily understood by those skilled in the art that modes and details can be modified in various ways without departing from the spirit and scope of the present invention. Therefore, the description disclosed in this disclosure is not interpreted as being limited to the description of the embodiments below.

Note that a "source" of a transistor means a source region that is part of a semiconductor film functioning as an active layer or a source electrode electrically connected to the semiconductor film. Similarly, a "drain" of a transistor means a drain region that is part of a semiconductor film

Embodiment 1

Figure 1A:
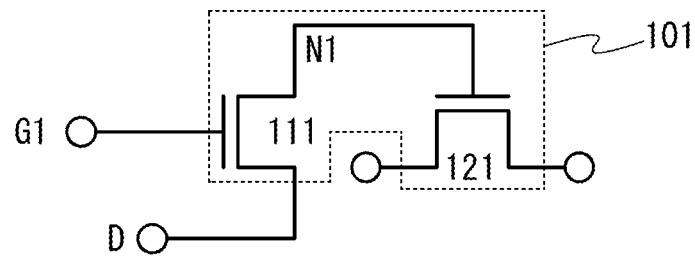
FIGS. 1A and 1B illustrate a circuit example of a signal processing device.
Figure 1B:
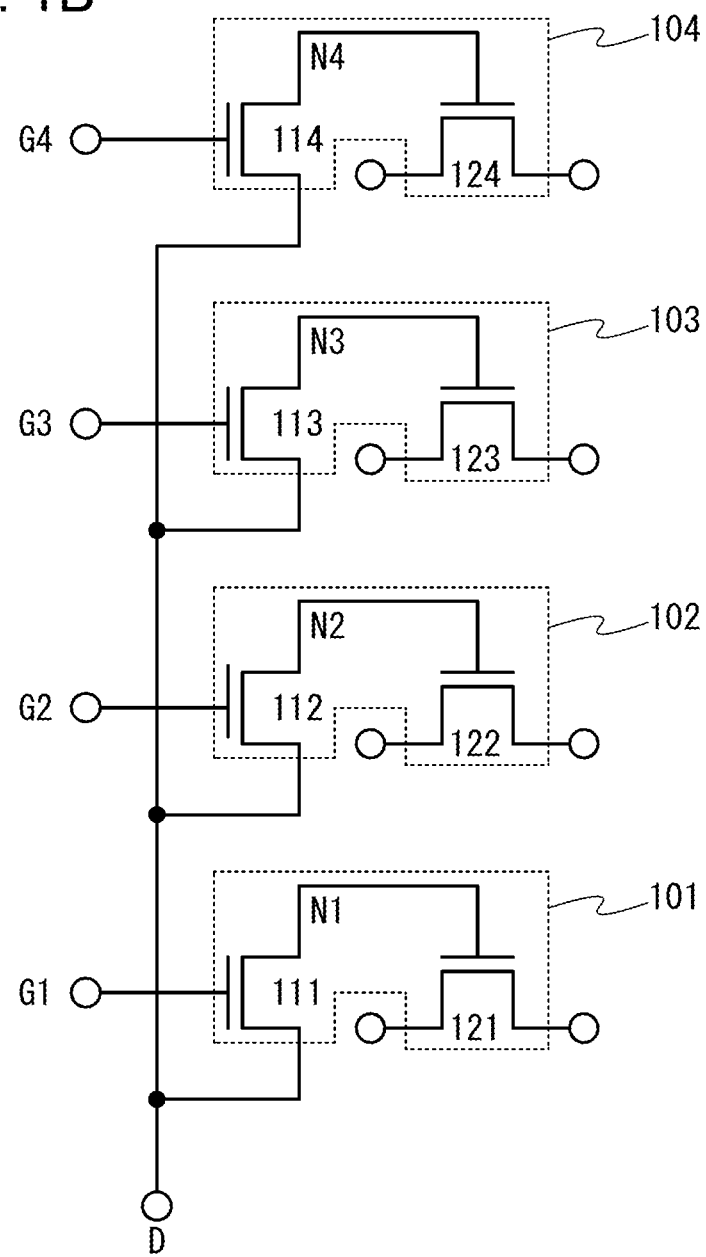

FIGS. 1A and 1B illustrate an example of a circuit used in a signal processing device. In a programmable switch 101 in FIG. 1A, conduction between a source and a drain of a pass transistor 121 is controlled by the potential of a gate of the pass transistor 121. In the programmable switch 101, the gate of the pass transistor 121 is directly or indirectly connected to one of a source and a drain of a writing transistor 111. The on/off of the writing transistor 111 is controlled by the potential of a writing control terminal G1.

Although any kind of transistor can be used as the writing transistor 111, the writing transistor 111 needs to have sufficiently high off-state resistance in order to keep the potential of the gate of the pass transistor 121 (node N1) for required time. Any of the transistors disclosed in Patent Documents 1 to 3 can be used.

The pass transistor 121 can be of various kinds and is preferably a transistor with low on-state resistance. Furthermore, the pass transistor 121 may be either an n-channel transistor or a p-channel transistor. Hereinafter, the case where the pass transistor 121 is an n-channel transistor is described.

For example, the writing transistor 111 is turned on in a state where both potentials of the source and the drain of the pass transistor 121 are low. By setting a difference between the potential of the node N1 and the low potential at higher than the threshold of the pass transistor 121, the pass transistor 121 is turned on. Even if the writing transistor 111 is turned off after that, the on state of the pass transistor 121 is maintained. This is because the potential of the node N1 is kept owing to the capacitance formed between the gate and a channel.

The potential of the node N1 might not be kept for required time in the case where the potential of the node N1 is set low. For example, the writing transistor 111 is turned on in a state where both potentials of the source and the drain of the pass transistor 121 are low, and then the potential of the node N1 is set low. If the writing transistor 111 is turned off in this state, the capacitance formed between the gate and the channel is extremely small because the pass transistor 121 is off. In the case like this, by keeping the potential of a data input terminal D low, the potential of the node N1 can be kept low.

The above operation for setting the potential of the node N1 at a required value and turning on or off the pass transistor 121 is referred to as configuration. A state where this operation can be performed is referred to as a configuration mode. Data for setting the potential of the node N1 is referred to as configuration data.

In a signal processing device including the programmable switch 101, arithmetic operation is performed normally when the writing transistor 111 is off, which is referred to as a user mode. In this state, the node N1 is floating and capacitively coupled with the source or the drain and the channel of the pass transistor 121 through the gate capacitance or the like of the pass transistor 121. Accordingly, a change in the potential of the source or the drain of the pass transistor 121 affects and changes the potential of the node N1.

In other words, in the case where a difference between the potential of the node N1 and the potential of the source of the pass transistor 121 is higher than the threshold of the pass transistor 121, the pass transistor 121 is on. In addition, owing to the capacitive coupling with the gate capacitance, an increase in the potential of the source or the drain causes an increase in the potential of the gate (the node N1), whereby the potential of the node N1 is increased. This effect is referred to as a boosting effect. In general, as the capacitance between the gate and the channel (or the source or the drain) of the pass transistor 121 is larger and another capacitance (including parasitic capacitance) that is connected to the node N1 is smaller, this effect is larger.

For example, in the case where the boosting effect is not obtained at all, when a potential equal to the potential of the gate is applied to the drain of the pass transistor 121, the potential of the source is lower than that of the drain by the threshold of the pass transistor 121 (the potential of the drain>the potential of the source). However, if the potential of the node N1 is higher than the sum of the potential of the drain of the pass transistor 121 and the threshold of the pass transistor 121, the potential of the source can be equal to the potential of the drain.

This effect does not occur in a signal processing device in which an SRAM cell is connected to a gate of a pass transistor to supply a constant voltage. If the potential of the gate of the pass transistor is not enough, the potential of a source becomes lower than that of a drain, as described above. In order to avoid this, the potential of the gate of the pass transistor needs to be set high enough in advance.

A plurality of programmable switches 101 illustrated in FIG. 1A are provided in a programmable logic device. FIG. 1B illustrates an example of the programmable logic device. Part of the programmable logic device is illustrated in FIG. 1B. In each of writing transistors 111 to 114 of programmable switches 101 to 104, one of a source and a drain which is not connected to a gate of a pass transistor (121, 122, 123, or 124) is directly or indirectly connected to the data input terminal D.

In the configuration mode, while the conduction of the writing transistors 111 to 114 is controlled by the potentials of writing control terminals G1 to G4, data input to the programmable switches 101 to 104 is supplied to the data input terminal D; thus, nodes N1 N2, N3, and N4 of the programmable switches 101 to 104 can have required potentials.

In this programmable logic device, data of an arbitrary programmable switch can be rewritten; however, contacts for connecting the programmable switches 101 to 104 and the data input terminal D need to be provided.

Figure 2:
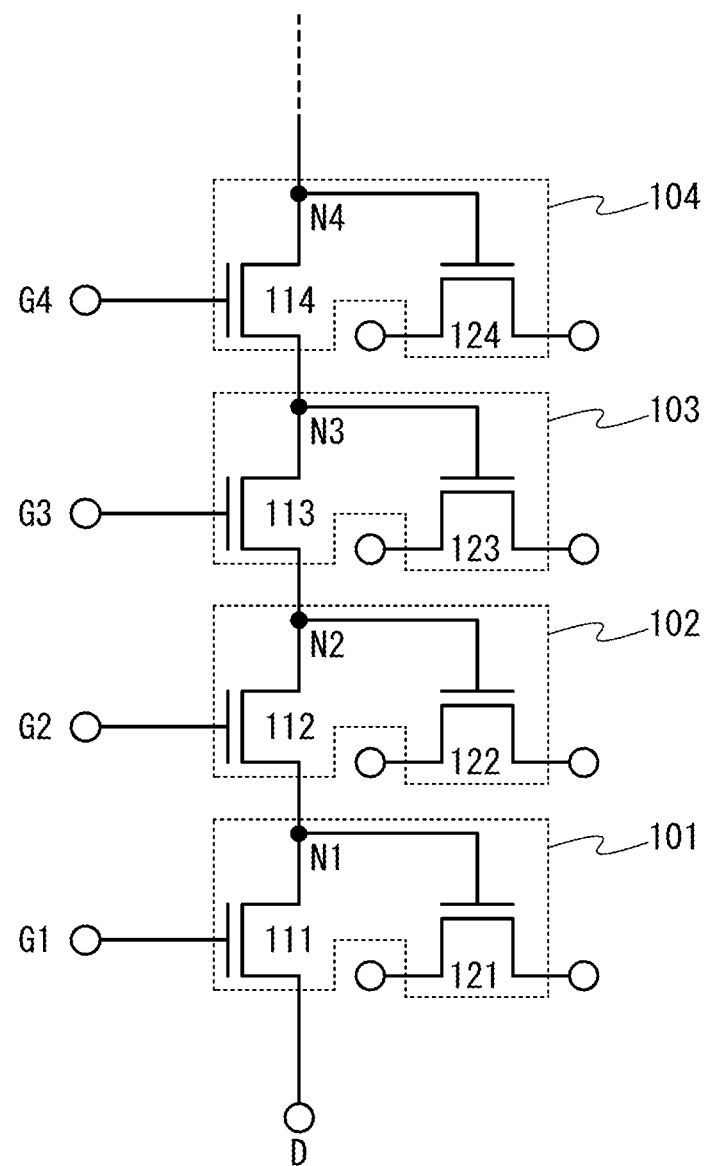
FIG. 2 illustrates a circuit example of a signal processing device.

FIG. 2 illustrates another example of a circuit including a plurality of programmable switches. FIG. 2 illustrates part of a programmable logic device. Also in this example, four programmable switches (the programmable switches 101 to 104) are illustrated. The writing transistors 111 to 114 of the programmable switches are connected in series. An element of some kind may be provided between the writing transistors 111 to 114. In this example, the contacts for connecting the programmable switches 101 to 104 to the data input terminal D are not necessary.

Therefore, the circuit configuration can be simplified. Furthermore, because the number of contacts can be reduced, contact defects are reduced and yield is improved. Furthermore, because the number of contacts is reduced, a high degree of integration can be achieved.

One of the source and the drain of the writing transistor 111 is directly or indirectly connected to the data input terminal D. One of a source and a drain of the writing transistor 114 is the node N4 and is directly or indirectly connected to the gate of the pass transistor 124.

The node N1 at which the writing transistor 111 is connected to the writing transistor 112 is connected to the gate of the pass transistor 121. The node N2 at which the writing transistor 112 is connected to the writing transistor 113 is connected to the gate of the pass transistor 122. The node N3 at which the writing transistor 113 is connected to the writing transistor 114 is connected to the gate of the pass transistor 123.

A method for writing data to the circuit having the above connection structure will be described. Writing of data needs to be performed sequentially. That is, when writing or rewriting of data is needed in any of the programmable switches, writing or rewriting of data needs to be performed not only in that programmable switch, but also in a programmable switch provided between the data input terminal D and that programmable switch.

For example, in the case where data of only the programmable switch 103 of the programmable switches 101 to 104 is changed, data is written to the programmable switch 103, then, the same data as the data that has been written to the programmable switch 102 is written to the programmable switch 102, and then, the same data as the data that has been written to the programmable switch 101 is written to the programmable switch 101.

Specifically, data written to the programmable switch 103 is input to the data input terminal D in the state where the writing transistors 111 to 113 are on and the writing transistor 114 is off. Then, data written to the programmable switch 102 (the same data that has been written to the programmable switch 102) is input to the data input terminal D in the state where the writing transistors 113 and 114 are off and the writing transistors 111 and 112 are on. Finally, data written to the programmable switch 101 (the same data that has been written to the programmable switch 101) is input to the data input terminal D in the state where the writing transistors 112 to 114 are off and the writing transistor 111 is on.

In this manner, data of a programmable switch that is not really necessary to be rewritten has to be rewritten in order to rewrite only data of a certain programmable switch; thus, processing takes a long time. On the other hand, for example, in the case where data of all the programmable switches 101 to 104 are rewritten, the rewriting can be carried out at about the same speed as that of the circuit in FIG. 1B.

In a programmable logic device, data of a programmable switch is less likely to be rewritten randomly, and rewriting is often carried out on a large block basis or in the entire device. For those cases, the circuit configuration in FIG. 2 and the above-described method for writing data do not cause many problems.

Figure 10:
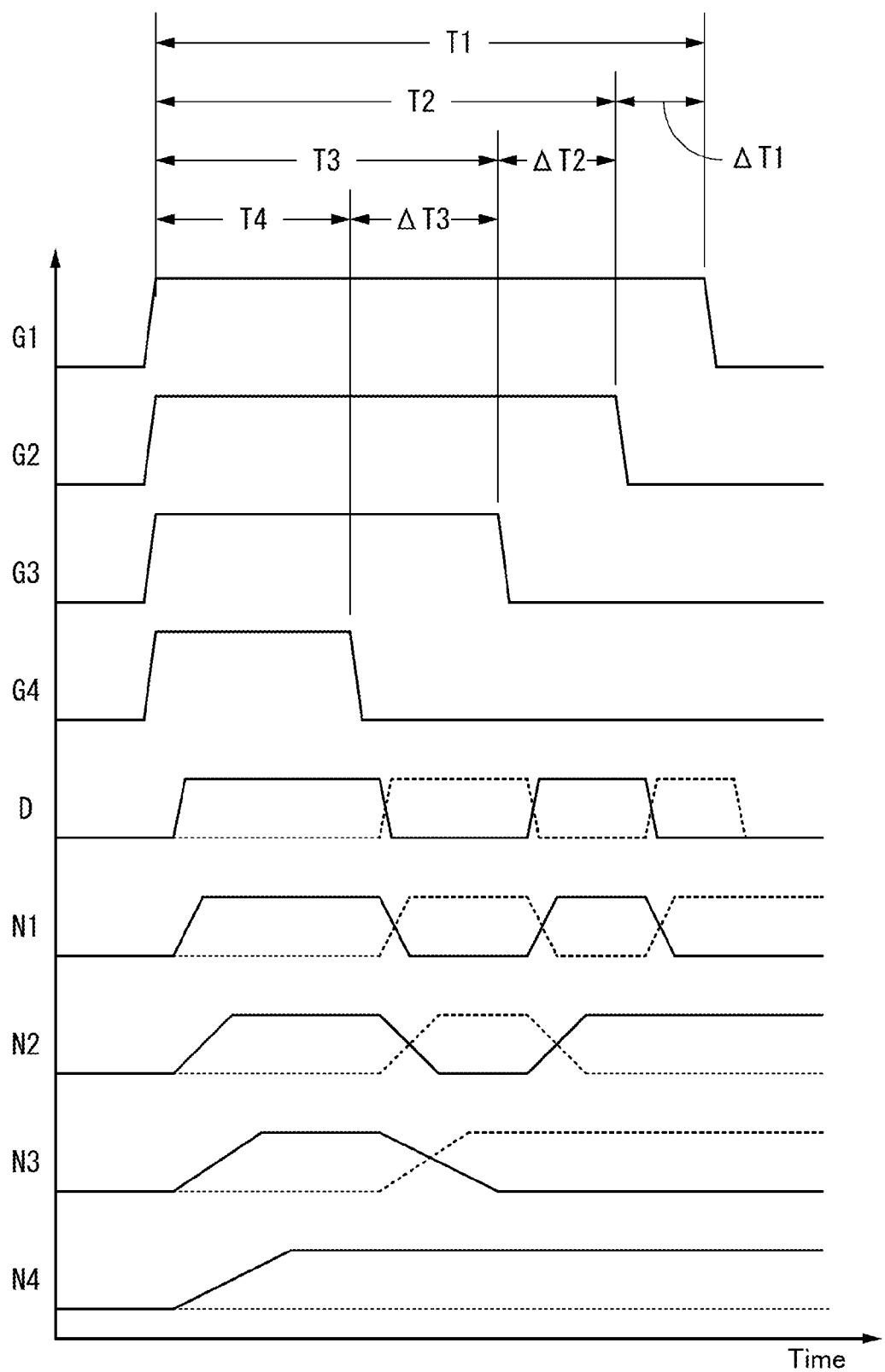
FIG. 10 illustrates an operation example of a signal processing device.

The case of rewriting data of all the programmable switches 101 to 104 in the circuit in FIG. 2 will be described with reference to FIG. 10. FIG. 10 shows two cases of potentials of the nodes N1 to N4: one is that the potentials of the nodes N1 to N4 are low, high, low, and high, respectively (represented by a solid line), and the other is that the potentials of the nodes N1 to N4 are high, low, high, and low, respectively (represented by a dotted line).

In either case, widths of pulses applied to the writing control terminals G1 to G4 are T1, T2, T3, and T4, respectively. In this example, applications of pulses to the writing control terminals G1 to G4 start at almost the same time and finish at different times. The pulse applied to the control terminal G4 is the shortest. The pulse applied to the control terminal G1 is the longest.

Here, in a period during which the pulses applied to the writing control terminals G1 to G4 overlap, the corresponding writing transistors are in an on state at the same time.

A difference between a period T1 and a period T2 ($\Delta$T1), a difference between the period T2 and a period T3 ($\Delta$T2), and a difference between the period T3 and a period T4 ($\Delta$T3) may be all the same or different. For example, $\Delta T1 < \Delta T2 < \Delta T3 < T4$ is possible. The periods $\Delta$T1, $\Delta$T2, $\Delta$T3, and T4 are periods that allow data to be written to the programmable switches 101, 102, 103, and 104, respectively.

As a programmable switch is farther from the data input terminal D, signal delay is increased and data writing takes longer time. Thus, T4 needs to be long enough. Conversely, signal delay is small and data is written in a short time in a programmable switch close to the data input terminal D; thus, $\Delta$T1 may be short. In this manner, $\Delta$T1, $\Delta$T2, $\Delta$T3, and T4 are set in consideration of signal delay, so that data can be written in all the programmable switches in a shorter time.

Figure 3:
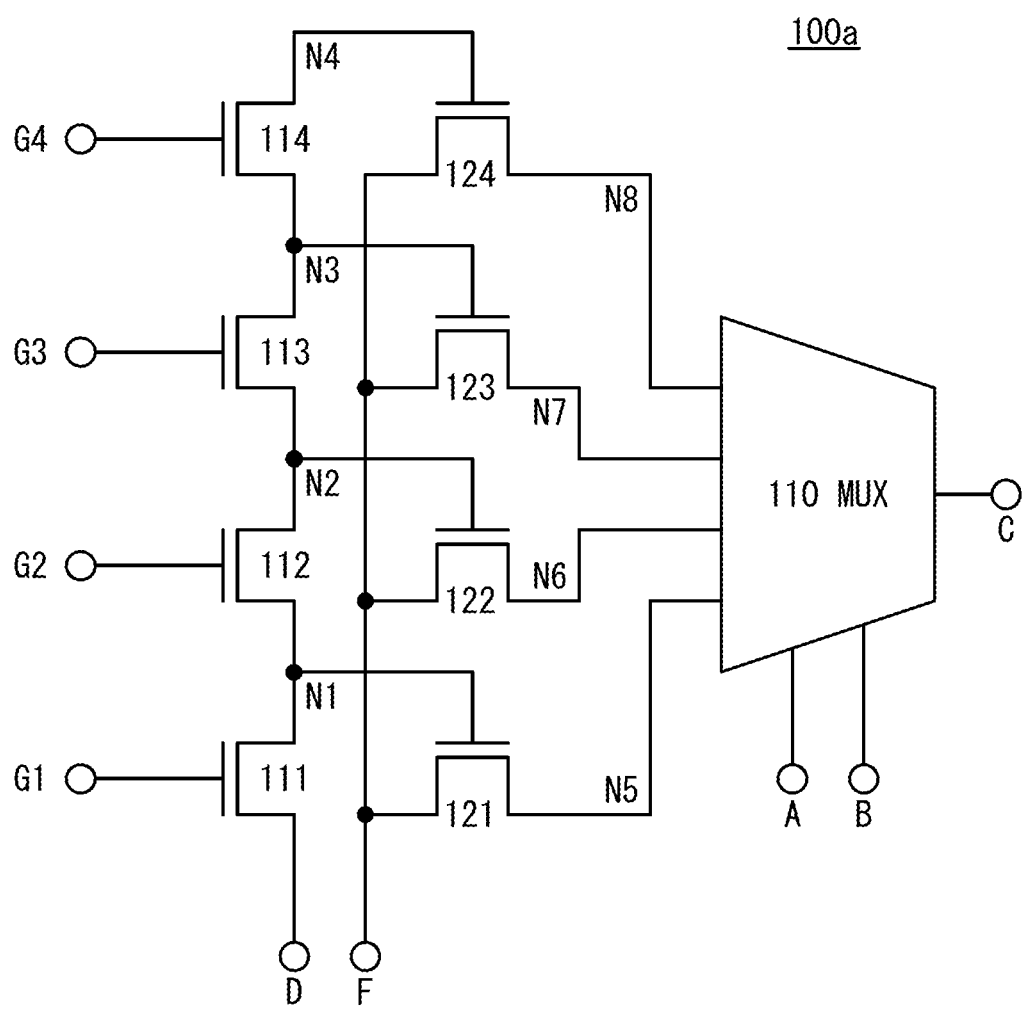
FIG. 3 illustrates a circuit example of a signal processing device.

FIG. 3 illustrates an application example of the circuit in FIG. 2, that is, a lookup table 100a. In FIG. 2, portions to which the source and the drain of each of the pass transistors 121 to 124 are connected are not illustrated, whereas in the lookup table 100a, one of the source and the drain of each of the pass transistors 121 to 124 is directly or indirectly connected to an input terminal of a multiplexer 110, and the other is directly or indirectly connected to a signal input terminal F.

Any one of the four input terminals is electrically connected to an output terminal C in accordance with signals input to a selection control terminal A and a selection control terminal B. A signal is input to the signal input terminal F to determine the potential of the output terminal depending on the conduction state of the pass transistor that is electrically connected to the one input terminal.

A method for inputting data to the lookup table 100a in the configuration mode is similar to the input method described in FIG. 2. Note that it is preferable that the potentials of the signal input terminal F and nodes N5 to N8 be all low.

Next, in the user mode, signals are input to the selection control terminals A and B. In accordance with the combination of the signals, a high potential or a low potential is output from the output terminal C. Also in this case, both potential of the output terminal C and the signal input terminal F are set low at first, and then, the output terminal C is set in a floating state and the potential of the signal input terminal F is set high.

When the potential of the gate of the pass transistor that is selected in accordance with the combination of the signals of the selection control terminals A and B is high, the potential of the output terminal C is increased, whereas when the potential of the gate of the pass transistor is low, the potential of the output terminal C is little changed.

Note that if the potential of the signal input terminal F is high in the state where the potential of the gate of the pass transistor is fixed at high level, a potential lower by the threshold of the pass transistor than the potential of the signal input terminal F is output from the pass transistor.

In the lookup table 100a in FIG. 3, however, each gate of the pass transistors 121 to 124 is floating; thus, the potentials of the source and/or drain of each pass transistor vary the potential of the gate.

For example, in the configuration mode, both the source and the drain of each of the pass transistors 121 to 124 are set at low level and each gate is set at high level, and then, each gate is set in a floating state. Then, at the time of changing the potential of the signal input terminal F to high level in the user mode, the potential of each gate of the pass transistors is changed to higher than the high potential by the boosting effect. As a result, the potential output from the pass transistors is higher than that of the pass transistors whose gates are fixed at the high level, or becomes the high potential in some cases. Further, when the potential of each gate of the pass transistors becomes higher than the high potential, the on-state resistance of the pass transistors is decreased.

Figure 4:
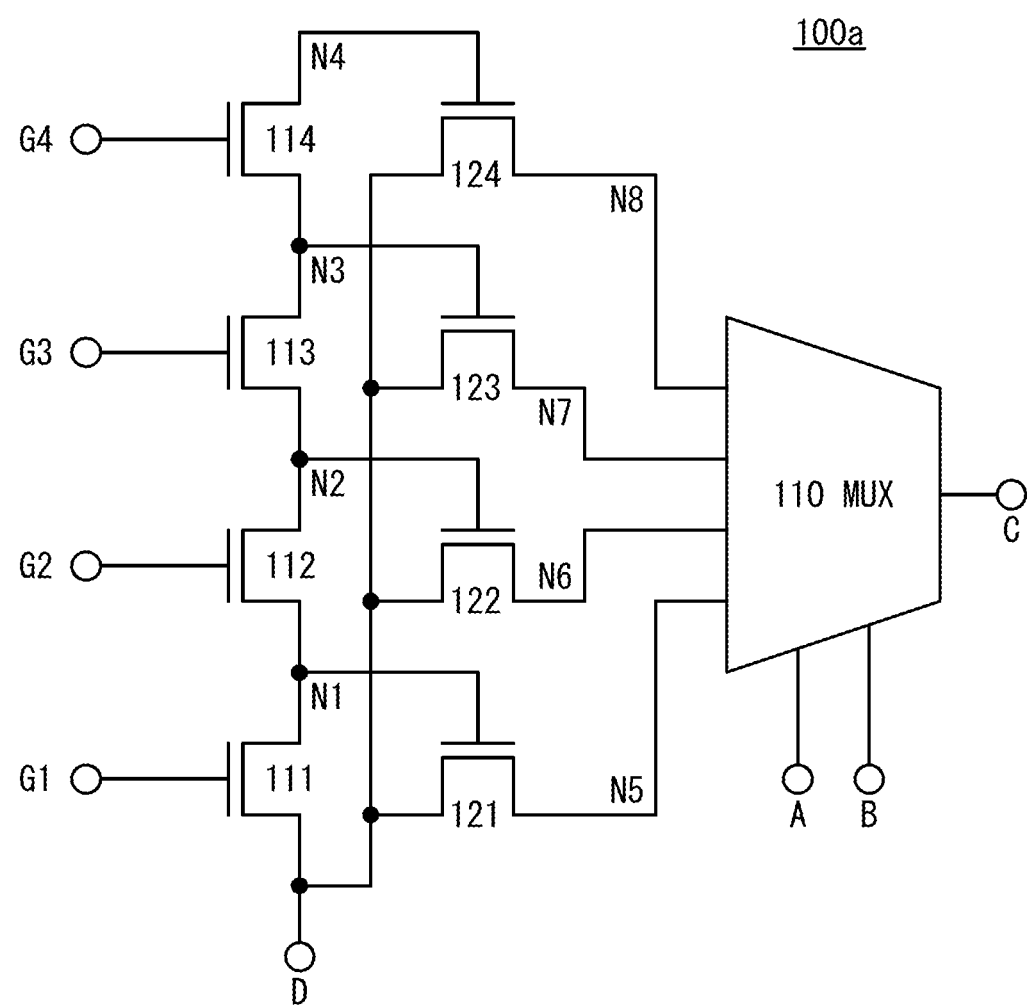
FIG. 4 illustrates a circuit example of a signal processing device.

A lookup table illustrated in FIG. 4 is a variation of the one illustrated in FIG. 3, in which the circuit configuration is simplified by connecting the signal input terminal F to the data input terminal D. The connection of those input terminals does not cause any problem because the data input terminal D is used only in the configuration mode and the signal input terminal F is used only in the user mode.

Figure 5:
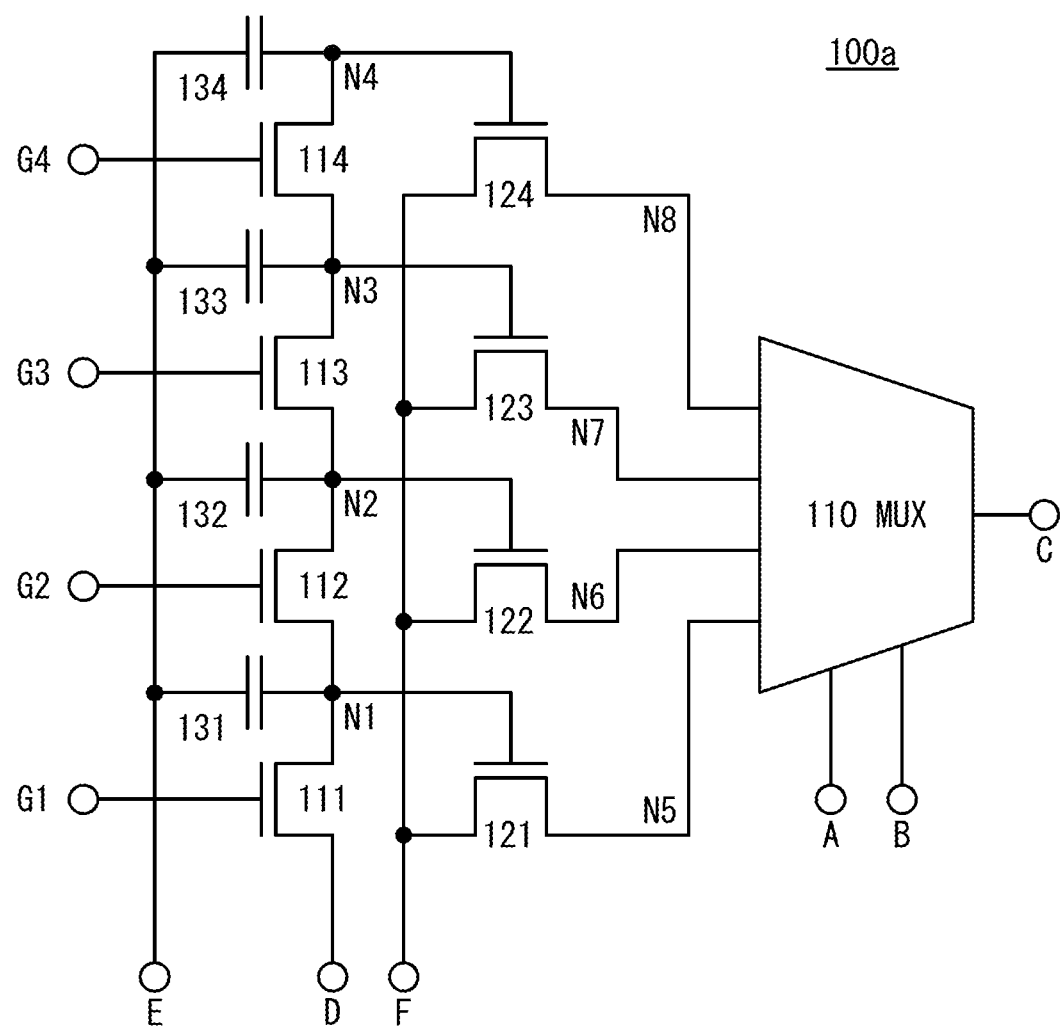
FIG. 5 illustrates a circuit example of a signal processing device.

A lookup table illustrated in FIG. 5 is a variation of the one illustrated in FIG. 3, in which capacitors 131 to 134 are connected to the nodes N1 to N4, respectively, of FIG. 3. With the capacitors 131 to 134, the potentials of the nodes N1 to N4 can be kept for a longer time. In this case, however, the boosting effect becomes smaller.

The following data writing method in the configuration mode can suppress the reduction of the boosting effect. For example, in the case where the pass transistor 124 is turned on in the user mode, a high potential and a low potential are input to the data input terminal D and a capacitor potential supply terminal E, respectively, at the time of inputting data of the pass transistor 124. Conversely, in the case where the pass transistor 124 is turned off in the user mode, a low potential and a high potential are input to the data input terminal D and the capacitor potential supply terminal E, respectively. Then, in the user mode, the potential of the capacitor potential supply terminal E is set at high level, so that the potential of the node N4 becomes higher than the high potential in the former case and keeps at the low level in the latter case.

Figure 6:
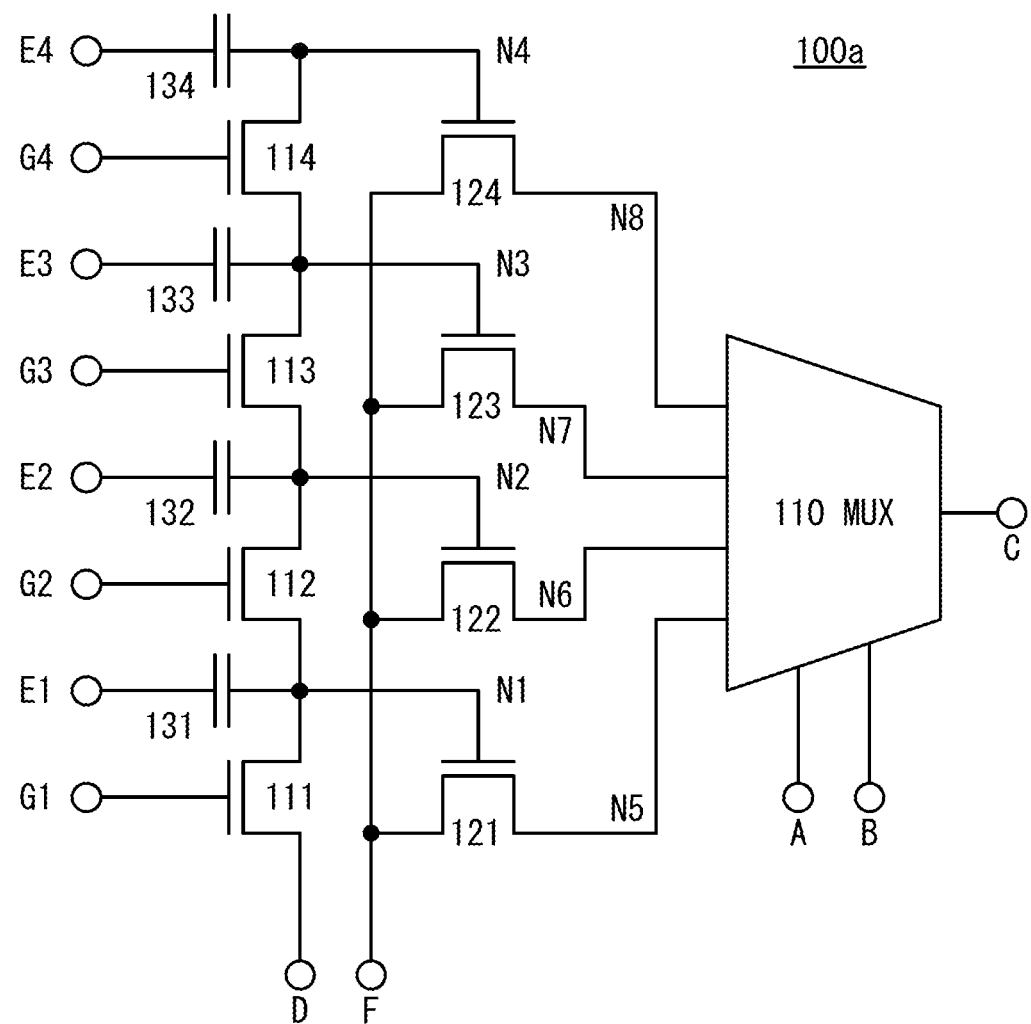
FIG. 6 illustrates a circuit example of a signal processing device.

A lookup table illustrated in FIG. 6 is a variation of the one illustrated in FIG. 3, in which electrodes on one side of the capacitors 131 to 134 are connected to the nodes N1 to N4, respectively, of FIG. 3 and the potentials of electrodes on the other side of the capacitors 131 to 134 are controlled by potentials applied to capacitor potential control terminals E1 to E4, respectively.

Figure 7:
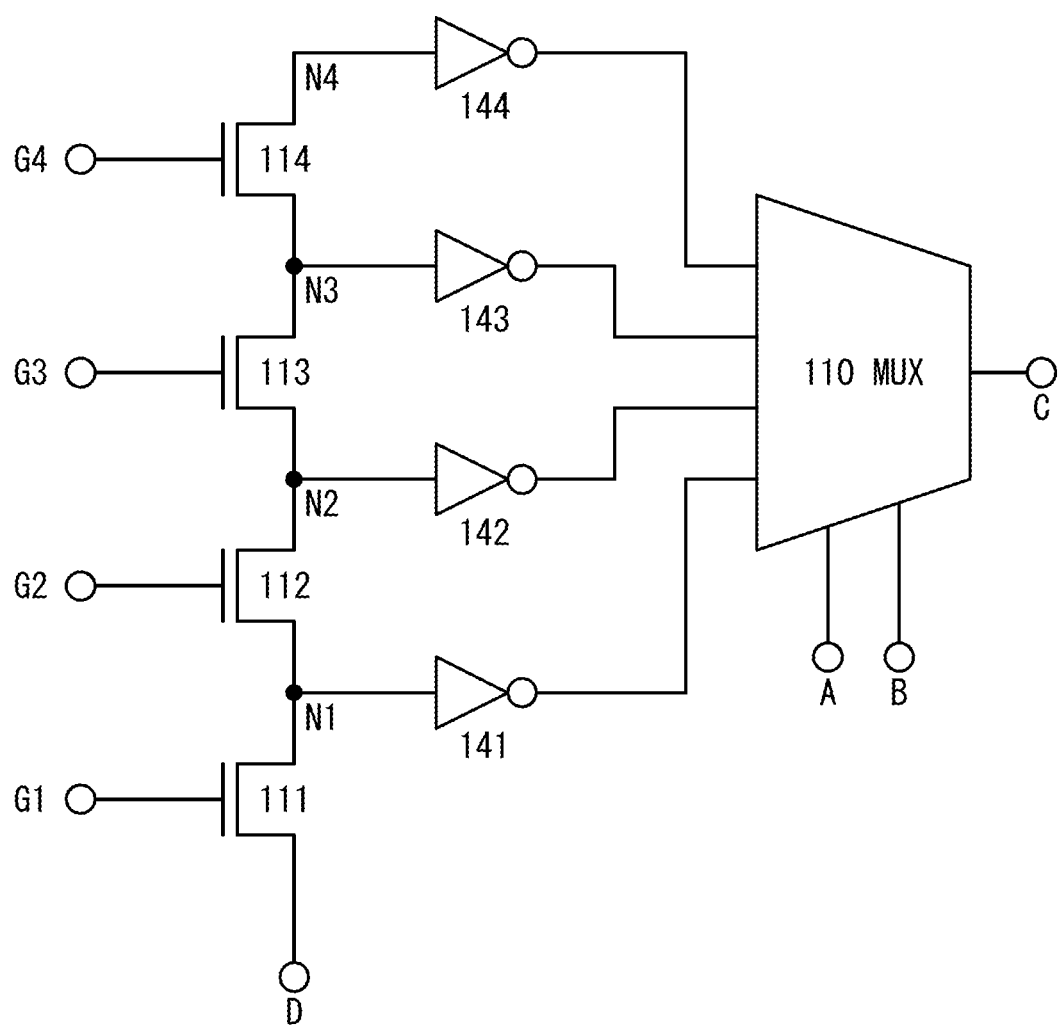
FIG. 7 illustrates a circuit example of a signal processing device.

Although the gates of the pass transistors are connected to the nodes N1 to N4 in the above examples, input terminals of inverters 141 to 144 may be directly or indirectly connected as illustrated in FIG. 7.

Figure 8:
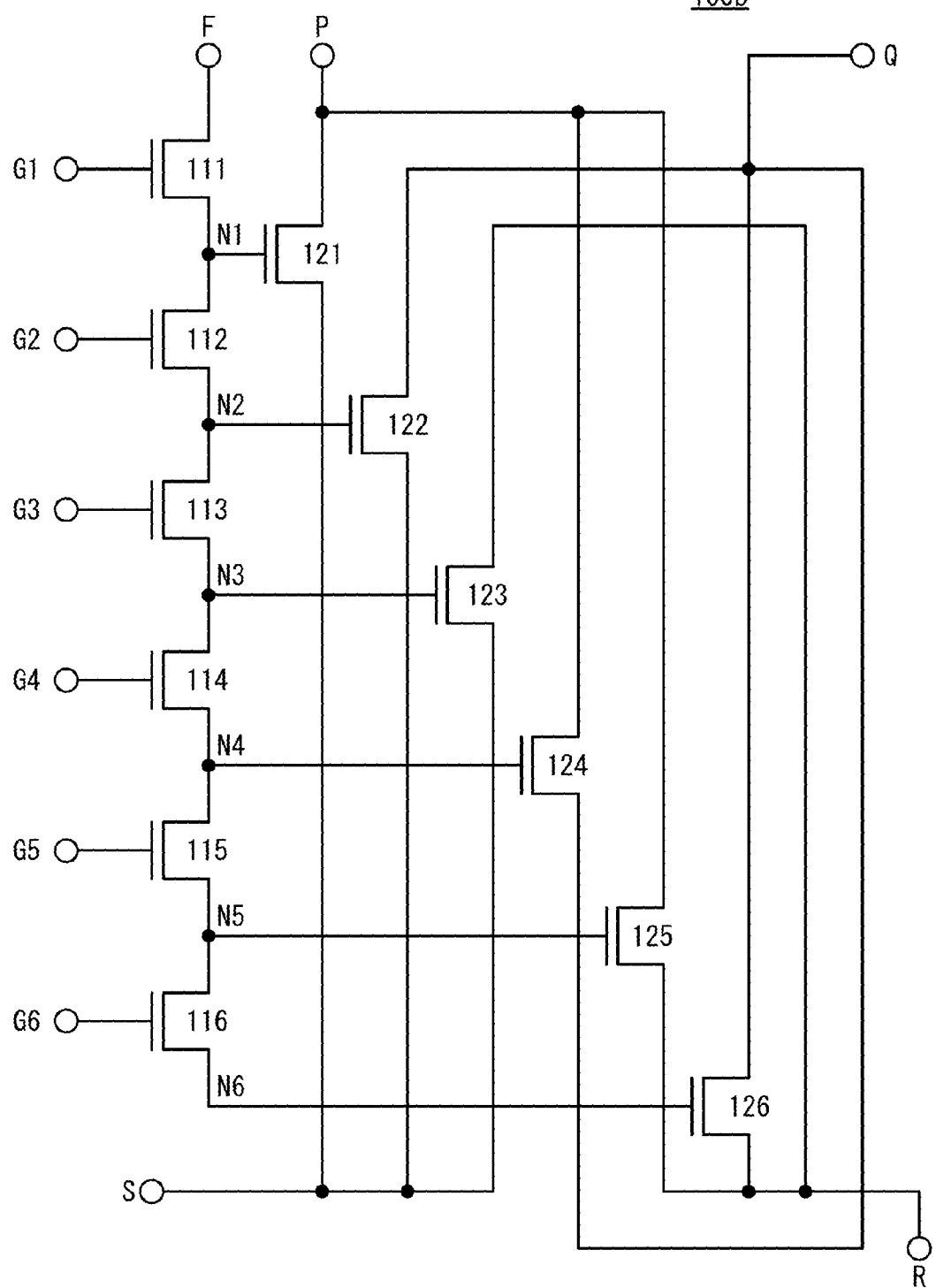
FIG. 8 illustrates a circuit example of a signal processing device.

The application examples of the circuit in FIG. 2 are not limited to lookup tables and may include a switch circuit 100b provided at a junction as illustrated in FIG. 8. In FIG. 8, electrical connection among four terminals P, Q, R, and S is controlled by pass transistors 121 to 126. Gates of the pass transistors 121 to 126 are connected to nodes N1 to N6 of writing transistors 111 to 116 connected in series. The writing transistors 111 to 116 are controlled by writing control terminals G1 to G6.

Figure 9:
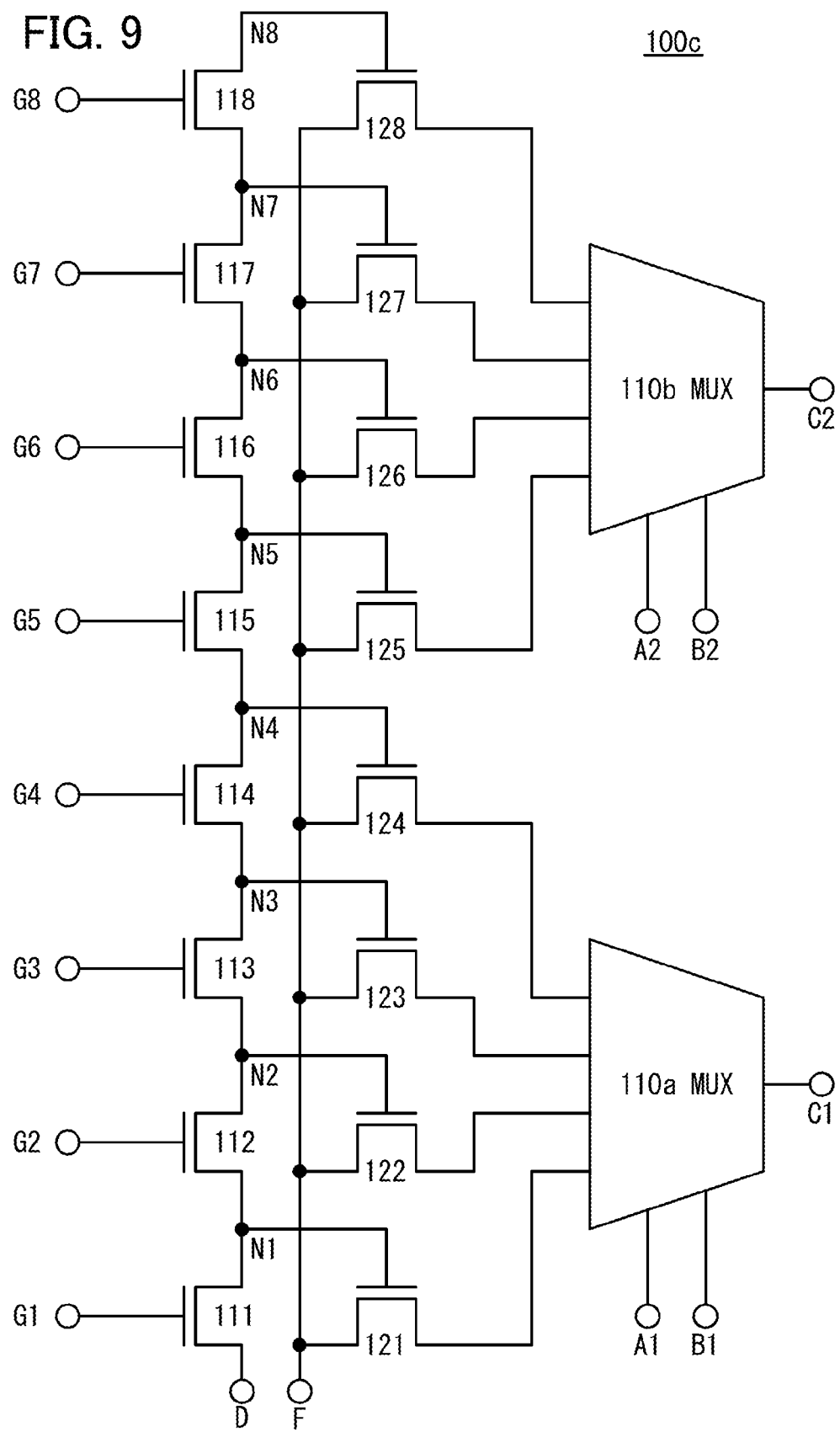
FIG. 9 illustrates a circuit example of a signal processing device.

Furthermore, in part 100c of a programmable logic device, a circuit in which writing transistors are connected in series may be directly or indirectly connected to two or more multiplexers, two or more switch circuits, a combination of multiplexers and switch circuits, or a plurality of other circuits (e.g., see FIG. 9). Here, writing transistors 111 to 118 are connected in series, and nodes N1 to N8 are directly or indirectly connected to gates of pass transistors 121 to 128. The pass transistors 121 to 124 are directly or indirectly connected to a multiplexer 110a, and the pass transistors 125 to 128 are directly or indirectly connected to a multiplexer 110b. The writing transistors 111 to 118 are controlled by writing control terminals G1 to G8.

Signals are input to selection control terminals A1, A2, B1 and B2. In accordance with the combination of the signals, a high potential or a low potential is output from output terminals C1 and C2.

Features of the circuits illustrated in FIG. 3, FIG. 4, FIG. 5, FIG. 6, FIG. 7, FIG. 8, and FIG. 9 may be combined.

Next, an oxide semiconductor that can be used in the writing transistor 111 and the like will be described below.

The oxide semiconductor contains, for example, indium. An oxide semiconductor containing indium has high carrier mobility (electron mobility). An oxide semiconductor preferably contains an element M. The element M is aluminum, gallium, yttrium, or tin, for example. The element M is an element having a high bonding energy with oxygen, for example. The element M increases the energy gap of the oxide semiconductor, for example. Further, the oxide semiconductor preferably contains zinc. When containing zinc, the oxide semiconductor is likely to be crystalline. The valence band maximum (Ev) of the oxide semiconductor can be controlled by, for example, the atomic ratio of zinc, in some cases.

The oxide semiconductor does not necessarily contain indium. The oxide semiconductor may be, for example, Zn—Sn oxide or Ga—Sn oxide.

The oxide semiconductor may be an In-M-Zn oxide having any of the following atomic ratios of In to M: the atomic percentage of In is smaller than 50 atomic % and the atomic percentage of M is larger than or equal to 50 atomic %; and the atomic percentage of In is smaller than 25 atomic % and the atomic percentage of M is larger than or equal to 75 atomic %, when the total of In and M is assumed to be 100 atomic %. Further, the oxide semiconductor may be In-M-Zn oxide having any of the following atomic ratios of In to M when the total of In and M is assumed to be 100 atomic %: the atomic percentage of In is larger than or equal to 25 atomic % and the atomic percentage of M is smaller than 75 atomic %; and the atomic percentage of In is larger than or equal to 34 atomic % and the atomic percentage of M is smaller than 66 atomic %.

The oxide semiconductor has a large energy gap. The energy gap of the oxide semiconductor is greater than or equal to 2.7 eV and less than or equal to 4.9 eV, preferably greater than or equal to 3 eV and less than or equal to 4.7 eV, further preferably greater than or equal to 3.2 eV and less than or equal to 4.4 eV.

In order to obtain stable electrical characteristics of a transistor, it is effective to reduce the concentration of impurities in the oxide semiconductor so that the oxide semiconductor is highly purified to be intrinsic. In the oxide semiconductor, a light element, a metalloid element, a metal element, or the like (lower than 1 atomic %) other than main components serve as impurities. For example, hydrogen, lithium, carbon, nitrogen, fluorine, sodium, silicon, chlorine, potassium, calcium, titanium, iron, nickel, copper, germanium, strontium, zirconium, and hafnium might be impurities to the oxide. Accordingly, the concentration of impurities in an adjacent layer is preferably reduced.

For example, in some cases, silicon in an oxide semiconductor forms impurity states. Further, in some cases, silicon at the surface of an oxide semiconductor forms impurity states. The concentration of silicon in an oxide semiconductor or at the surface of an oxide semiconductor measured by secondary ion mass spectrometry (SIMS) is preferably lower than $1\times10^{19}$ atoms/cm$^3$, further preferably lower than $5\times10^{18}$ atoms/cm$^3$, still further preferably lower than $2\times10^{18}$ atoms/cm$^3$.

Further, in some cases, hydrogen in an oxide semiconductor forms impurity states, whereby carrier density is increased. Thus, the concentration of hydrogen in the oxide semiconductor, which is measured by SIMS, can be set to lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Furthermore, in some cases, nitrogen in an oxide semiconductor forms impurity states, whereby carrier density is increased. Thus, the concentration of nitrogen in the oxide semiconductor, which is measured by SIMS, can be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

An oxide semiconductor may include a non-single-crystal, for example. The non-single-crystal state is, for example, structured by at least one of c-axis aligned crystal (CAAC), polycrystal, microcrystal, and an amorphous part.

An oxide semiconductor may include CAAC, for example. Note that an oxide semiconductor including CAAC is referred to as a CAAC-OS (c-axis aligned crystalline oxide semiconductor).

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear boundary does not exist, for example, high density of defect states is unlikely to occur. In the CAAC-OS, since a clear grain boundary does not exist, for example, a reduction in electron mobility is unlikely to occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at 2θ of around 31 degrees which shows alignment appears in some cases. Further, for example, spots (luminescent spots) are observed in an electron diffraction pattern of the CAAC-OS in some cases. An electron diffraction pattern obtained with an electron beam having a beam diameter of 10 nmφ or smaller, or 5 nmφ or smaller, is called a nanobeam electron diffraction pattern. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

In each of the crystal parts included in the CAAC-OS, for example, a c-axis is aligned in a direction parallel to a normal vector of a surface where the CAAC-OS is formed or a normal vector of a surface of the CAAC-OS, triangular or hexagonal atomic arrangement that is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

Further, the CAAC-OS can be formed by reducing the density of defect states for example. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has low density of trap states in some cases. Thus, the transistor including the oxide semiconductor in the channel formation region has a small variation in electrical characteristics and high reliability in some cases. A charge trapped by the trap states in the oxide semiconductor takes a long time to disappear. The trapped charge may behave like a fixed charge. Thus, the transistor which includes the oxide semiconductor having a high density of trap states in the channel formation region has unstable electrical characteristics in some cases.

With the use of the highly purified intrinsic or substantially highly purified intrinsic CAAC-OS in a transistor, variation in the electrical characteristics of the transistor due to irradiation with visible light or ultraviolet light is small.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with a TEM, for example, a boundary between crystal parts is not clearly detected in some cases. In an image of the nc-OS obtained with a TEM, for example, since a clear grain boundary does not exist, for example, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is unlikely to occur.

In the nc-OS, for example, a microscopic region (for example, a region with a size greater than or equal to 1 nm and less than or equal to 10 nm) has a periodic atomic order occasionally. Further, for example, in the nc-OS, crystal parts are not regularly-arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than the diameter of a crystal part, a peak which shows alignment does not appear in some cases. Further, for example, a halo pattern is shown in some cases in an electron diffraction pattern of the nc-OS obtained by using an electron beam having a beam diameter larger than the diameter of a crystal part (for example, a beam diameter of 20 nmϕ or more, or 50 nmϕ or more). For example, spots are shown in some cases in a nanobeam electron diffraction pattern of the nc-OS obtained by using an electron beam having a beam diameter smaller than or equal to the diameter of a crystal part (for example, a beam diameter of 10 nmϕ or less, or 5 nmϕ or less). In a nanobeam electron diffraction pattern of the nc-OS, for example, regions with high luminance in a circular pattern are shown in some cases. In a nanobeam electron diffraction pattern of the nc-OS, for example, a plurality of spots is shown in the region in some cases.

Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

The oxide semiconductor may be a multilayer film. For example, a multilayer film in which an oxide semiconductor layer (S1) and an oxide semiconductor layer (S2) are formed in this order may be used.

In this case, the conduction band minimum (Ec) of the oxide semiconductor layer (S2) is made lower than that of the oxide semiconductor layer (S1), for example. Specifically, for the oxide semiconductor layer (S2), an oxide semiconductor having higher electron affinity than the oxide semiconductor layer (S1) by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used. Note that the electron affinity refers to an energy gap between the vacuum level and the conduction band minimum.

Alternatively, the energy gap of the oxide semiconductor layer (S2) is made smaller than that of the oxide semiconductor layer (S1), for example. The energy gap can be obtained by, for example, an optical method. Specifically, for the oxide semiconductor layer (S2), an oxide semiconductor having smaller energy gap than the oxide semiconductor layer (S1) by greater than or equal to 0.1 eV and smaller than or equal to 1.2 eV or by greater than or equal to 0.2 eV and smaller than or equal to 0.8 eV is used.

Alternatively, the oxide semiconductor may be, for example, a multilayer film in which the oxide semiconductor layer (S1), the oxide semiconductor layer (S2), and an oxide semiconductor layer (S3) are formed in this order.

For example, the conduction band minimum (Ec) of the oxide semiconductor layer (S2) is set to be lower than that of the oxide semiconductor layer (S1) and the oxide semiconductor layer (S3). Specifically, for the oxide semiconductor layer (S2), an oxide semiconductor having higher electron affinity than the oxide semiconductor layers (S1) and (S3) by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used.

Alternatively, for example, the energy gap of the oxide semiconductor layer (S2) may be smaller than that of each of the oxide semiconductor layers (S1) and (S3). Specifically, for the oxide semiconductor layer (S2), an oxide semiconductor having smaller energy gap than the oxide semiconductor layers (S1) and (S3) by greater than or equal to 0.1 eV and smaller than or equal to 1.2 eV or by greater than or equal to 0.2 eV and smaller than or equal to 0.8 eV is used.

To increase the on-state current of the top-gate transistor, for example, the thickness of the oxide semiconductor layer (S3) is preferably as small as possible. For example, the thickness of the oxide semiconductor layer (S3) is less than 10 nm, preferably less than or equal to 5 nm, further preferably less than or equal to 3 nm. In contrast, the oxide semiconductor layer (S3) blocks entry of elements (e.g., silicon) contained in the gate insulating film to the oxide semiconductor layer (S2) having a high current density. Thus, the oxide semiconductor layer (S3) preferably has a certain thickness. For example, the thickness of the oxide semiconductor layer (S3) is greater than or equal to 0.3 nm, preferably greater than or equal to 1 nm, further preferably greater than or equal to 2 nm.

The oxide semiconductor layer (S1) is preferably formed thick. The oxide semiconductor layers (S2) and (S3) are preferably formed thin. Specifically, the thickness of the oxide semiconductor layer (S1) is greater than or equal to 20 nm, preferably greater than or equal to 30 nm, further preferably greater than or equal to 40 nm, still further preferably greater than or equal to 60 nm. Specifically, the thickness of the oxide semiconductor layer (S1) is greater than or equal to 20 nm, preferably greater than or equal to 30 nm, further preferably greater than or equal to 40 nm, still further preferably greater than or equal to 60 nm. With the oxide semiconductor layer (S1) having the above thickness, the interface between the insulating film and the oxide semiconductor layer (S1) can be separated from the oxide semiconductor layer (S2) having a high current density by a distance of greater than or equal to 20 nm, preferably greater than or equal to 30 nm, further preferably greater than or equal to 40 nm, still further preferably greater than or equal to 60 nm. To prevent the productivity of the semiconductor device from being lowered, the thickness of the oxide semiconductor layer (S1) is smaller than or equal to 200 nm, preferably smaller than or equal to 120 nm, further preferably smaller than or equal to 80 nm. The thickness of the oxide semiconductor layer (S2) is greater than or equal to 3 nm and less than or equal to 100 nm, preferably greater than or equal to 3 nm and less than or equal to 80 nm, further preferably greater than or equal to 3 nm and less than or equal to 50 nm.

For example, the thickness of the oxide semiconductor layer (S1) may be greater than that of the oxide semiconductor layer (S2), and the thickness of the oxide semiconductor layer (S2) may be greater than that of the oxide semiconductor layer (S3).

A single layer or a multiple layer including the above described oxide semiconductor can be used in a channel of the transistor 111 and the like.

Embodiment 2

Figure 11A:
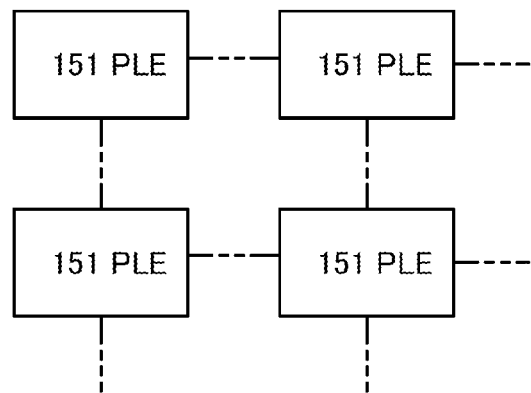
FIGS. 11A and 11B illustrate a structure example of a programmable logic device and a structure example of a programmable logic element, respectively.

FIG. 11A is a block diagram illustrating a structure of a programmable logic device. Although the block diagram attached to this specification shows components classified by their functions in independent blocks, it is difficult to classify actual components according to their functions completely, and one component can have a plurality of functions.

As illustrated in FIG. 11A, the programmable logic device 150 includes a plurality of programmable logic elements 151. Electrical connection (possibility of connection) between the programmable logic elements 151 is controlled in accordance with configuration data including data for defining connection between the programmable logic elements 151.

Specifically, the programmable logic elements 151 can be electrically connected to each other by a wiring element that includes a wiring group including a plurality of wirings and a switch circuit for controlling electrical connection between the wirings included in the wiring group in accordance with configuration data.

Figure 11B:
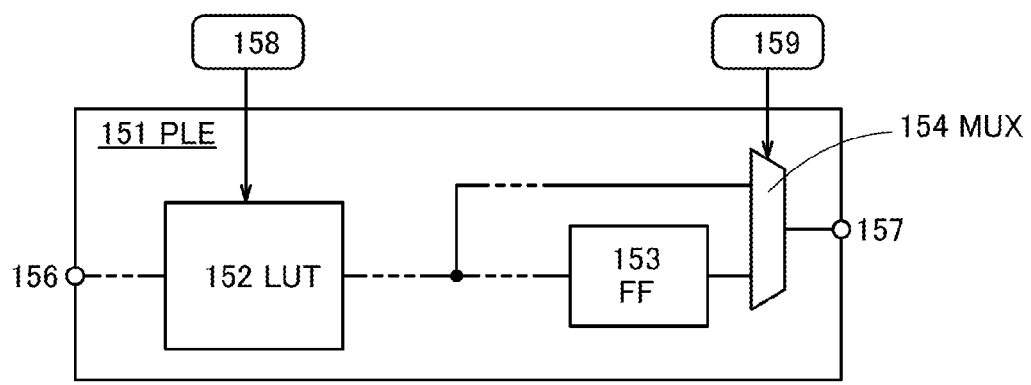

FIG. 11B is a block diagram illustrating a structure example of the programmable logic element 151. The programmable logic element 151 includes at least a lookup table 152, a flip-flop 153, and a multiplexer 154.

Configuration data 158 including data for specifying the function of the lookup table 152 as a logic gate is input to the lookup table 152. In other words, a relationship between a logic level of a signal input from a terminal 156 to the lookup table 152 and a logic level of a signal output from the lookup table 152 is determined in accordance with the configuration data 158. For example, the lookup table 152 may have any of the circuit configurations of the lookup table 100a illustrated in FIGS. 3 to 7 or a circuit configuration developed from any of the circuit configurations illustrated in FIGS. 3 to 7.

An output signal from the lookup table 152 is input to the flip-flop 153. Further, an output signal from the flip-flop 153 included in one programmable logic element 151 is sometimes input to the flip-flop 153 included in another programmable logic element 151. The flip-flop 153 has a function of holding these input signals.

Configuration data 159 including data for controlling the operation of the multiplexer 154 is input to the multiplexer 154. The multiplexer 154 has a function of selecting either a signal output from the lookup table 152 or a signal output from the flip-flop 153 in accordance with the configuration data 159. A signal selected by the multiplexer 154 is output from a terminal 157 of the programmable logic element 151.

<Structure Example of Programmable Logic Element>

Figure 12A:
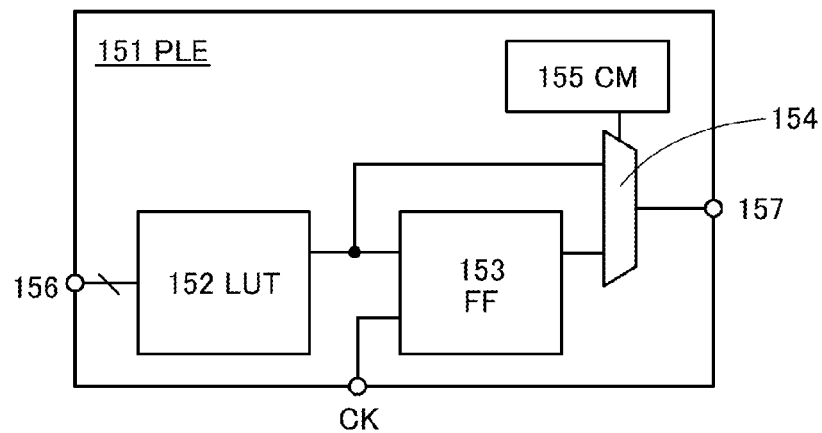
FIGS. 12A and 12B illustrate structure examples of a programmable logic element.

FIG. 12A illustrates a specific structure example of the programmable logic element 151 in FIG. 11B. The programmable logic element 151 in FIG. 12A includes the lookup table 152 storing configuration data, the flip-flop 153, the multiplexer 154, and a configuration memory 155 storing the configuration data 159 for the multiplexer 154.

The lookup table 152 carries out different logic operation depending on the stored configuration data. When the logical operation executed by the lookup table 152 is determined by the configuration data, the lookup table 152 generates an output signal corresponding to a plurality of input signals supplied to the terminal 156. The flip-flop 153 holds the output signal generated in the lookup table 152 and outputs an output signal corresponding to the signal in synchronization with a signal CK.

The output signals from the lookup table 152 and the flip-flop 153 are input to the multiplexer 154. The multiplexer 154 has a function of selecting and outputting one of the two output signals in accordance with configuration data stored in the configuration memory 155. The output signal from the multiplexer 154 is applied to the terminal 157.

Figure 12B:
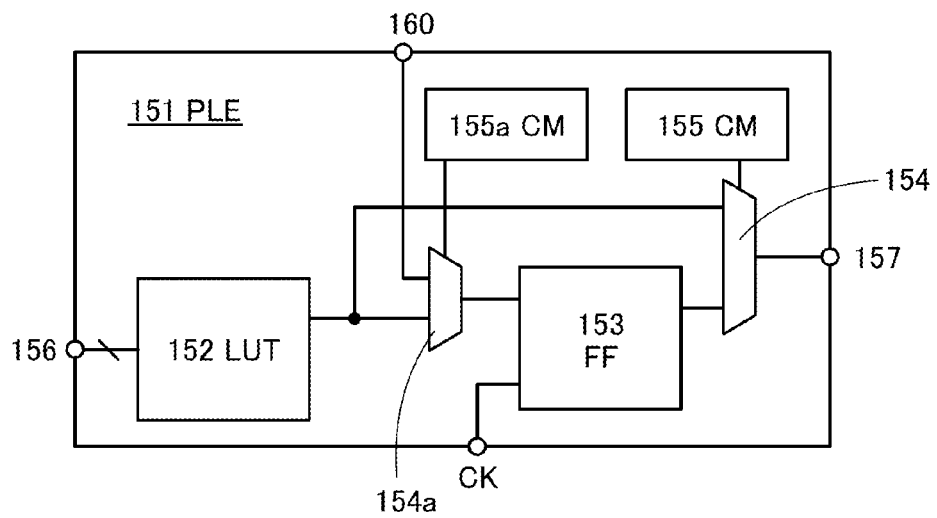

FIG. 12B illustrates another specific example of the programmable logic element 151 in FIG. 11B. Unlike the programmable logic element 151 in FIG. 12A, the programmable logic element 151 in FIG. 12B further includes a multiplexer 154a and a configuration memory 155a storing configuration data for the multiplexer 154a.

An output signal from the lookup table 152 and an output signal from the flip-flop 153 included in another programmable logic element 151 that is input through a terminal 160 are input to the multiplexer 154a. The multiplexer 154a has a function of selecting and outputting one of the above two output signals in accordance with configuration data stored in the configuration memory 155a.

In the programmable logic element 151 in FIG. 12B, the flip-flop 153 holds the output signal from the multiplexer 154a and outputs a signal corresponding to the output signal from the lookup table 152 in synchronization with the signal CK.

Note that the programmable logic element 151 illustrated in FIG. 12A or FIG. 12B may have a structure that allows configuration data to determine the type of the flip-flop 153. Specifically, the flip-flop 153 may function as any of a D flip-flop, a T flip-flop, a JK flip-flop, and an RS flip-flop depending on the configuration data.

<Structure Example of Programmable Logic Device>

Figure 13A:
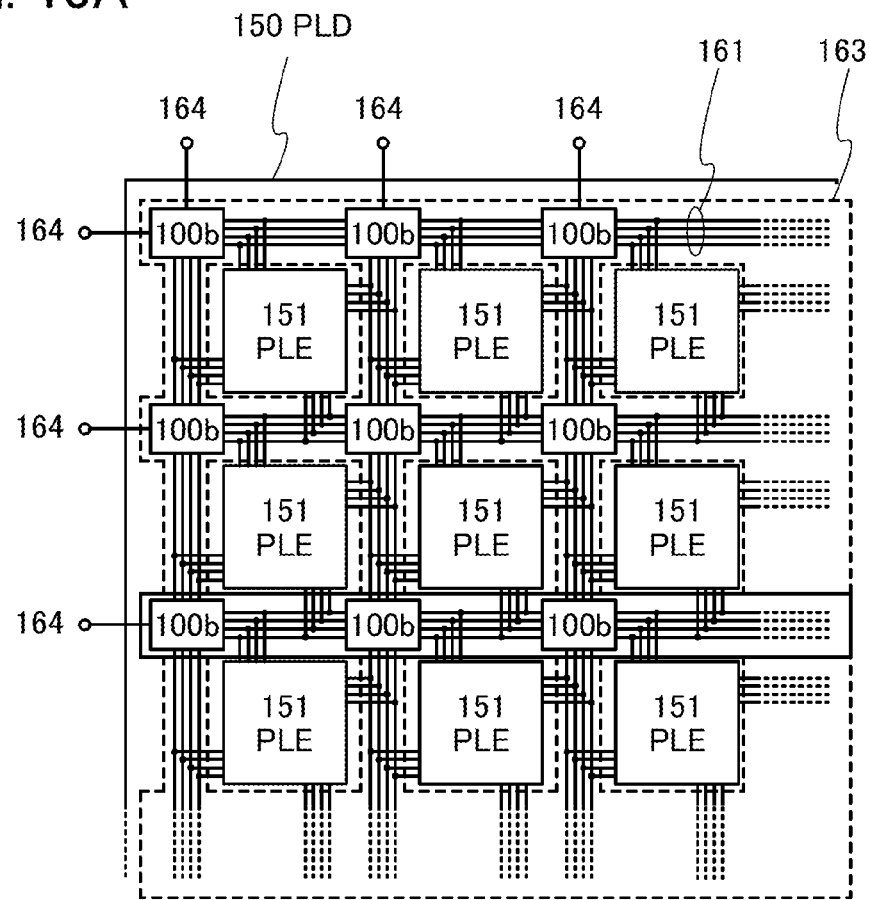
FIGS. 13A and 13B illustrate a structure example of a programmable logic device and a structure example of a switch circuit, respectively.

FIG. 13A schematically illustrates part of the structure of the programmable logic device 150 as an example. The programmable logic device 150 illustrated in FIG. 13A includes the plurality of programmable logic elements 151, a wiring group 161 connected to any of the plurality of programmable logic elements 151, and switch circuits 100b which control electrical connection between the wirings included in the wiring group 161. The wiring group 161 and the switch circuits 100b constitute a routing resource 163. The electrical connection between the wirings controlled by the switch circuits 100b is determined by configuration data.

Figure 13B:
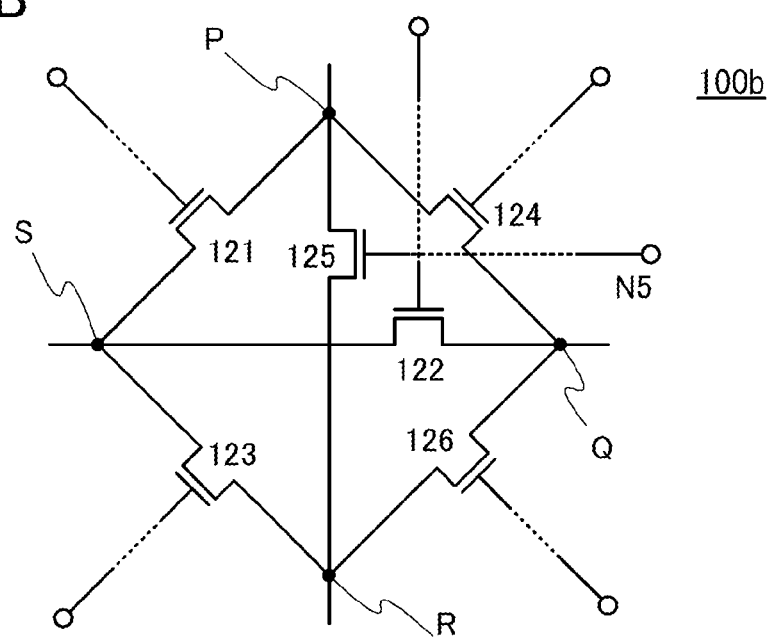

FIG. 13B illustrates a structure example of the switch circuit 100b. The switch circuit 100b illustrated in FIG. 13B is an equivalent to that illustrated in FIG. 8, and has a function of controlling the electrical connection structure between wirings included in the wiring group 161. Specifically, the switch circuit 100b includes pass transistors 121 to 126. The pass transistor 121 has a function of controlling electrical connection between a terminal P and a terminal S. The pass transistor 122 has a function of controlling electrical connection between a terminal Q and the terminal S. The pass transistor 123 has a function of controlling electrical connection between a terminal R and the terminal S. The pass transistor 124 has a function of controlling electrical connection between the terminal P and the terminal Q. The pass transistor 125 has a function of controlling electrical connection between the terminal P and the terminal R. The pass transistor 126 has a function of controlling electrical connection between the terminal Q and the terminal R.

Selection (switching) of the on state or off state of each of the pass transistors 121 to 126 is determined by configuration data. Specifically, in the case of the programmable logic device 150, the potentials of signals input to gates of the pass transistors 121 to 126 are determined by configuration data.

The switch circuit 100b also has a function of controlling electrical connection between the wiring group 161 and output terminals 164 of the programmable logic device 150.

Figure 14:
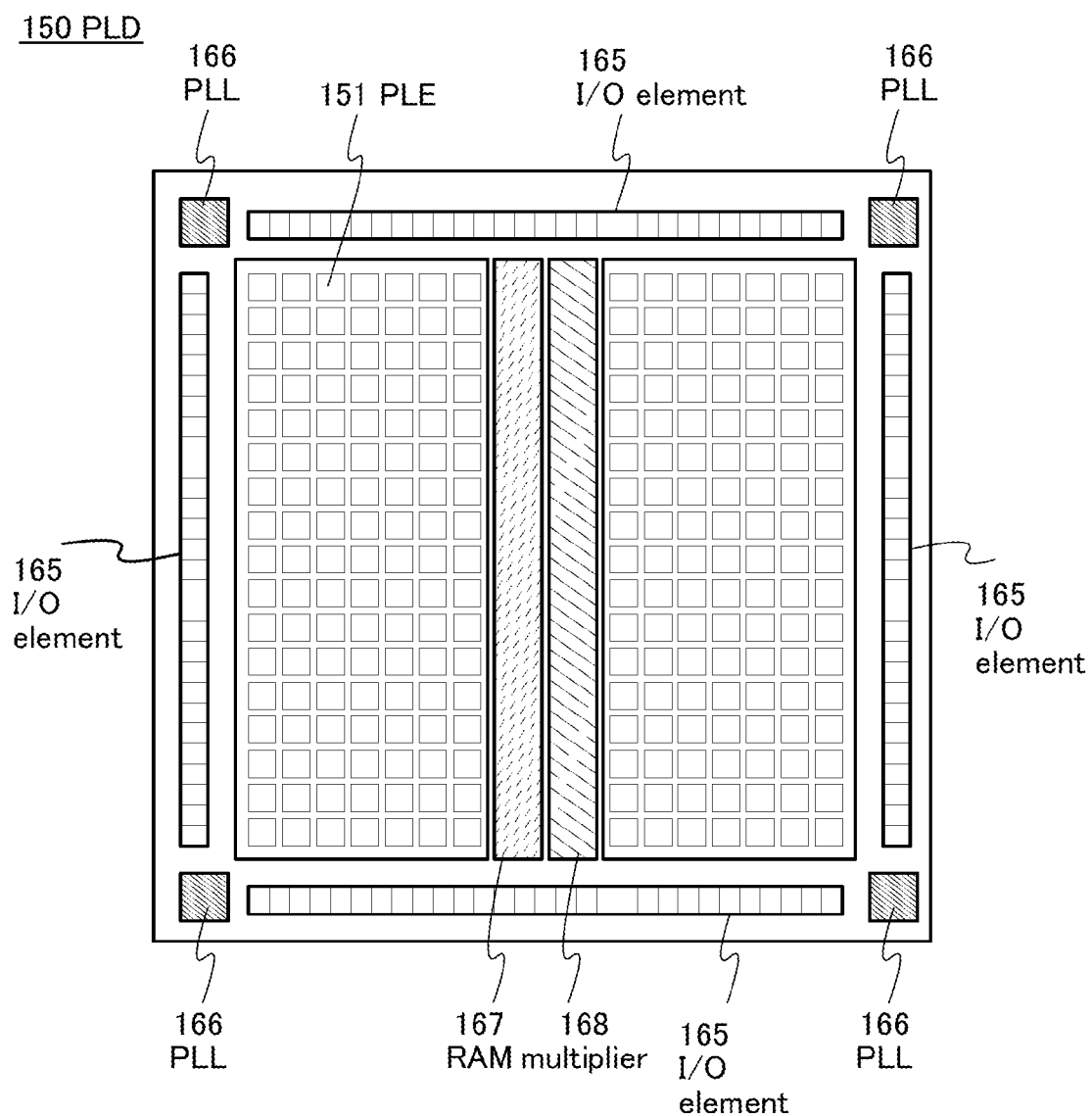
FIG. 14 illustrates a structure example of an entire programmable logic device.

FIG. 14 illustrates an entire structure example of the programmable logic device 150, as an example. In FIG. 14, I/O elements 165, phase lock loops (PLL) 166, a RAM 167, and a multiplier 168 are provided in the programmable logic device 150. The I/O element 165 functions as an interface that controls input of a signal from a circuit outside the programmable logic device 150 or output of a signal to the circuit outside the programmable logic device 150. The PLL 166 has a function of generating a signal CK. The RAM 167 has a function of storing data used for logic operation. The multiplier 168 corresponds to a logic circuit dedicated to multiplication. When the programmable logic device 150 includes a function of executing multiplication, the multiplier 168 is not necessarily provided.

<Example of Manufacturing Process of Programmable Logic Device>

An example of a manufacturing process of a programmable logic device is described with reference to FIGS. 15A to 15D, FIGS. 16A to 16C, and FIGS. 17A and 17B. For the details, Patent Documents 1 to 3 can be referred to. Note that FIGS. 15A to 15D simply illustrate a stacked-layer structure and do not necessarily illustrate cross sections of a specific portion. FIGS. 16A to 16C and FIGS. 17A and 17B illustrate a layout example of main components that constitute part of the lookup table illustrated in FIG. 4. Cross marks in FIGS. 16A to 16C and FIGS. 17A and 17B are markers for indicating the same position throughout the figures. By overlapping the markers of the figures, the positional relationship between the components can be understood.

Figure 15A:
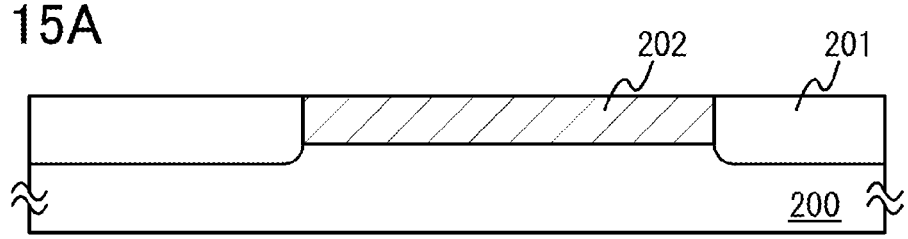
FIGS. 15A to 15D illustrate an example of a manufacturing process of a programmable logic device.
Figure 16C:
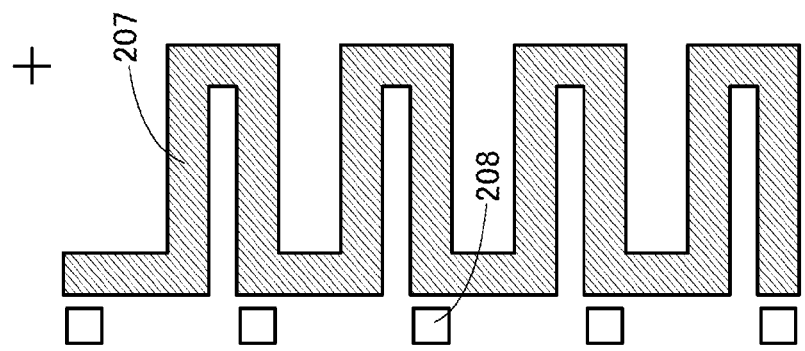
FIGS. 16A to 16C illustrate a layout example of main components of a programmable logic device.
Figure 16B:
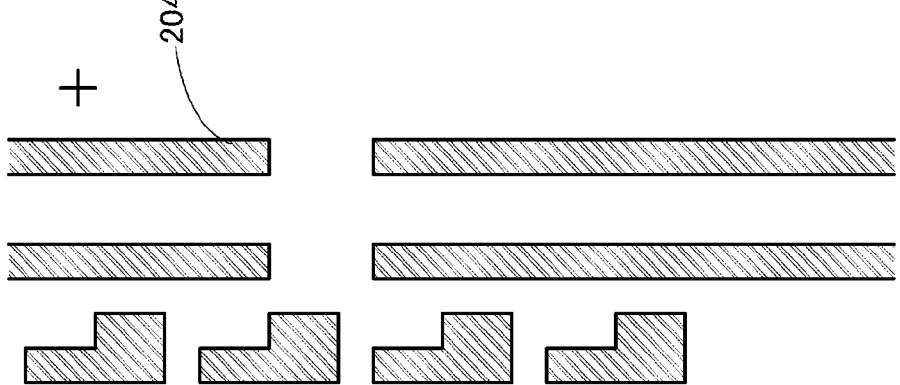
Figure 16A:
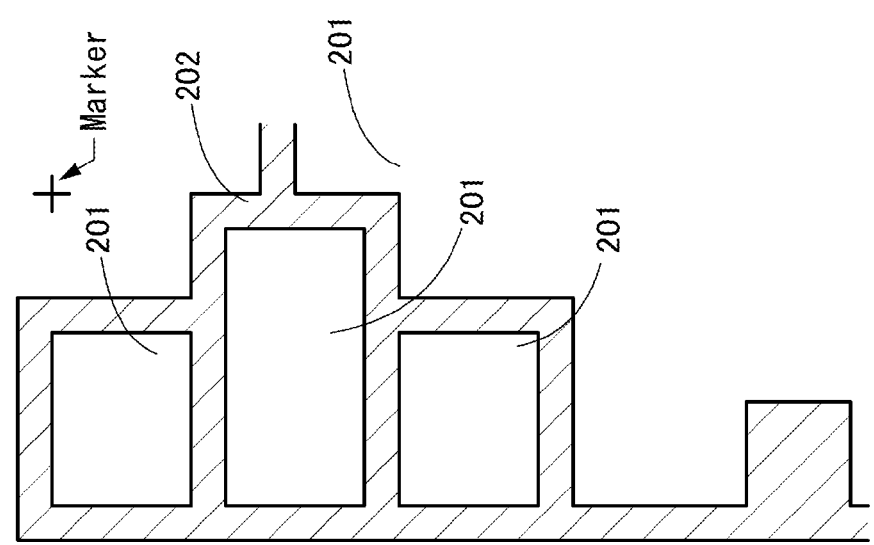

An element isolation insulator 201 and a p- or n-well 202 is provided in a single-crystal, polycrystalline, or amorphous semiconductor substrate 200 (FIG. 15A). An arrangement example of the element isolation insulator 201 and the well 202 is illustrated in FIG. 16A.

Figure 15B:
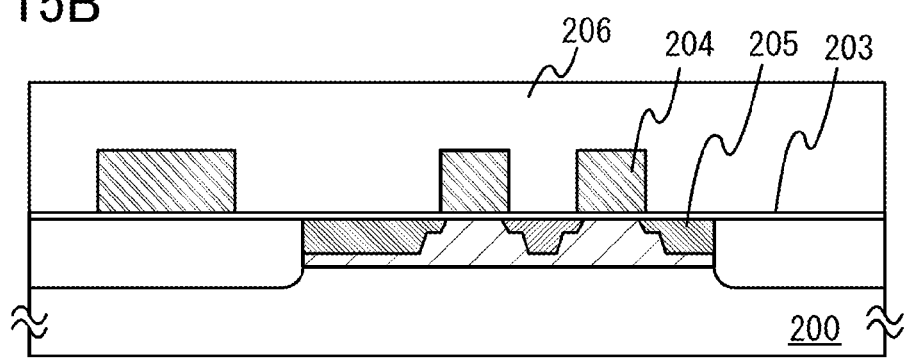

A first gate insulating film 203 and a first gate wiring 204 are formed. An impurity region 205 is formed in the well 202. A material having higher conductivity such as a silicide may be stacked over the impurity region. Further, a first interlayer insulator 206 is provided (FIG. 15B). The first interlayer insulator 206 is a single layer or a multilayer and preferably has the ability to supply oxygen to an upper layer and to block the transfer of hydrogen or water from a lower layer to the upper layer. An arrangement example of the first gate wiring 204 is illustrated in FIG. 16B.

Figure 15C:
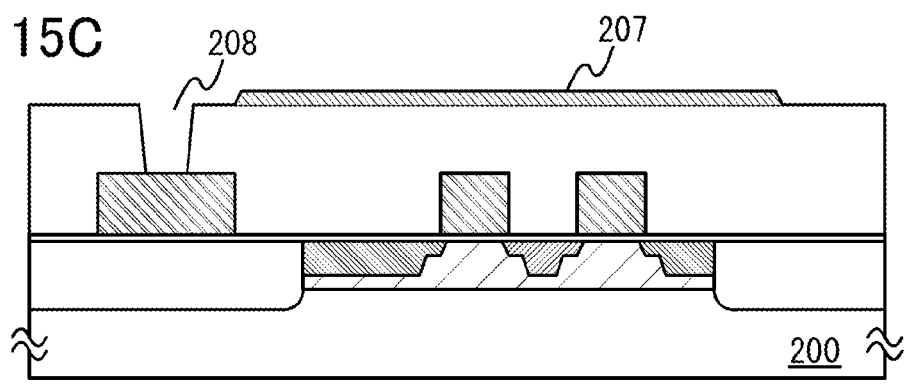

An oxide semiconductor layer 207 is provided over the first interlayer insulator 206, and a contact hole 208 is formed in the first interlayer insulator 206 (FIG. 15C). An arrangement example of the oxide semiconductor layer 207 and the contact hole 208 is illustrated in FIG. 16C. Note that a semiconductor other than an oxide semiconductor may be used. For example, a silicon film having a thickness of 2 nm or less may be used.

A conductive material is deposited to fill the contact hole. The oxide semiconductor layer 207 is covered with the conductive material. The conductive material is a single layer or a multilayer. Furthermore, the surface of the conductive material is planarized and an insulating material with a thickness of 100 nm or more is formed thereover. The insulating material is a single layer or a multilayer and is preferably capable of blocking the transfer of hydrogen or water from an upper layer to a lower layer.

Figure 17B:
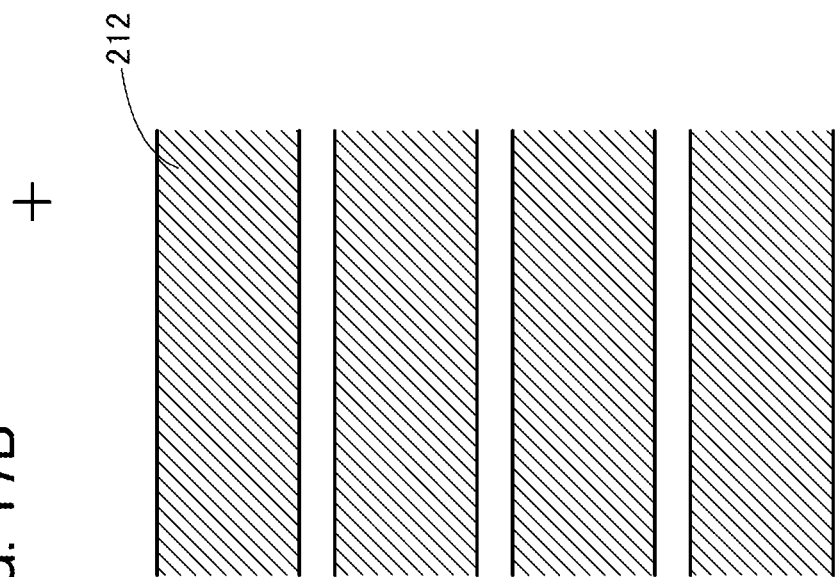
FIGS. 17A and 17B illustrate a layout example of main components of a programmable logic device.
Figure 17A:
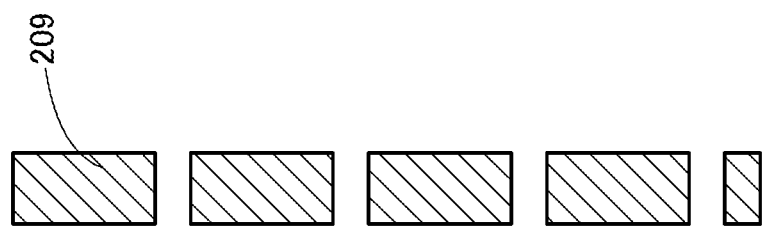

Then, the conductive material and the insulating material are selectively etched to form a wiring 209 and a second interlayer insulator 210, respectively. The wiring 209 and the second interlayer insulator 210 have similar shapes. In this etching, the conductive material is preferably used as an etching stopper of the insulating material. An arrangement example of the wiring 209 is illustrated in FIG. 17A.

Figure 15D:
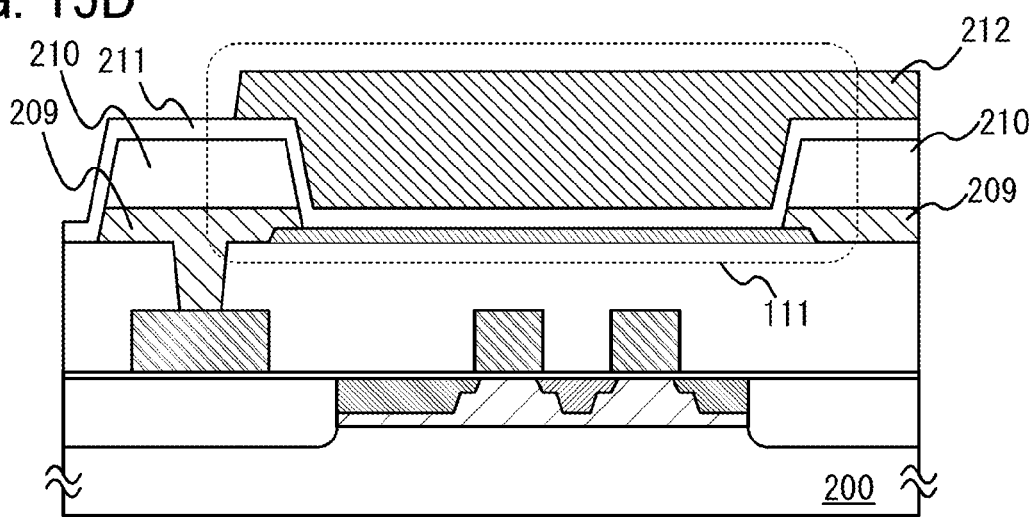

A second gate insulating film 211 is formed to cover the wiring 209 and the second interlayer insulator 210. Furthermore, a conductive material is deposited and the surface of the conductive material is planarized. The conductive material is a single layer or a multilayer and is preferably capable of blocking the transfer of hydrogen or water from an upper layer to a lower layer. The thickness of the conductive material is preferably larger than the distance between the top surface of the first interlayer insulator 206 and the top surface of the second interlayer insulator 210. The conductive material having the planarized surface is selectively etched to form a second gate wiring 212 (FIG. 15D). An arrangement example of the second gate wiring 212 is illustrated in FIG. 17B.

The existence of the second interlayer insulator 210 can reduce parasitic capacitance between the wiring 209 and the second gate wiring 212. In the above-described manner, the writing transistor 111 can be formed.

Note that as illustrated in FIG. 16C, a channel of the wiring transistor 111 is long and narrow. Thus, a short-channel effect is small and the off-state resistance is high. On the other hand, the on-state resistance is high and writing of data takes long time. However, it is less of an obstacle in practical use because writing of data is not performed frequently in a programmable logic device.

This application is based on Japanese Patent Application serial no. 2013-104129 filed with Japan Patent Office on May 16, 2013, the entire contents of which are hereby incorporated by reference.

What is claimed is:

1. A signal processing device comprising:
a first transistor;
a second transistor;
a third transistor;
a semiconductor layer;
a first wiring;
a second wiring; and
a third wiring,
wherein the first wiring, the second wiring, and the third wiring each overlap with the semiconductor layer,
wherein the first wiring, the second wiring, and the third wiring do not overlap with each other,
wherein potentials of the first to third wirings change conductivities of at least portions of the semiconductor layer that overlap with the first wiring, the second wiring, and the third wiring, wherein gates of the first to third transistors are electrically connected to the semiconductor layer,
wherein each of the gates of the first to third transistors is brought into a floating state depending on the conductivities of the portions of the semiconductor layer, and
wherein conduction between sources and drains of the first to third transistors is controlled by potentials of the respective gates in the floating state.

2. The signal processing device according to claim 1, wherein the semiconductor layer comprises an oxide semiconductor.

3. The signal processing device according to claim 2, wherein the oxide semiconductor includes indium, gallium, and zinc.

4. The signal processing device according to claim 1, further comprising a multiplexer including a first input terminal, a second input terminal, and a third input terminal,
wherein one of the source and the drain of the first transistor is electrically connected to the first input terminal,
wherein one of the source and the drain of the second transistor is electrically connected to the second input terminal,
wherein one of the source and the drain of the third transistor is electrically connected to the third input terminal, and
wherein a potential of the other of the source and the drain of the first transistor is equal to a potential of the other of the source and the drain of the second transistor and a potential of the other of the source and the drain of the third transistor.

5. The signal processing device according to claim 4, wherein a potential of part of the semiconductor layer is equal to the potential of the other of the source and the drain of the first transistor, the potential of the other of the source and the drain of the second transistor, and the potential of the other of the source and the drain of the third transistor.

6. A signal processing device comprising:
a first transistor;
a second transistor;
a third transistor;
a fourth transistor;
a first wiring; and
a multiplexer including a first input terminal and a second input terminal,
wherein one of a source and a drain of the first transistor is electrically connected to one of a source and a drain of the second transistor and a gate of the third transistor,
wherein the other of the source and the drain of the first transistor is electrically connected to a gate of the fourth transistor,
wherein one of a source and a drain of the third transistor and one of a source and a drain of the fourth transistor are electrically connected to the first wiring,
wherein the other of the source and the drain of the third transistor is electrically connected to the first input terminal,
wherein the other of the source and the drain of the fourth transistor is electrically connected to the second input terminal, and
wherein the gate of the third transistor and the gate of the fourth transistor are brought into a floating state depending on a potential of a gate of the first transistor and a potential of a gate of the second transistor.

7. The signal processing device according to claim 6, wherein the first transistor comprises a semiconductor layer, and
wherein the semiconductor layer comprises an oxide semiconductor.

8. The signal processing device according to claim 7, wherein the oxide semiconductor includes indium, gallium, and zinc.

9. A signal processing device comprising:
a first transistor;
a second transistor;
a third transistor; and
a fourth transistor,
wherein one of a source and a drain of the third transistor is electrically connected to one of a source and a drain of the fourth transistor and a gate of the first transistor,
wherein the other of the source and the drain of the fourth transistor is electrically connected to a gate of the second transistor,
wherein the gate of the first transistor and the gate of the second transistor are brought into a floating state depending on a potential of a gate of the third transistor and a potential of a gate of the fourth transistor.

10. The signal processing device according to claim 9, wherein the third transistor and the fourth transistor comprise an oxide semiconductor.

11. The signal processing device according to claim 10, wherein the oxide semiconductor includes indium, gallium, and zinc.

12. A signal processing device comprising:
a first transistor;
a second transistor;
a third transistor;
a fourth transistor;
a fifth transistor; and
a sixth transistor,
wherein one of a source and a drain of the first transistor is electrically connected to one of a source and a drain of the second transistor and a gate of the fourth transistor,
wherein the other of the source and the drain of the second transistor is electrically connected to one of a source and a drain of the third transistor and a gate of the fifth transistor,
wherein the other of the source and the drain of the third transistor is electrically connected to a gate of the sixth transistor,
wherein the gate of the fourth transistor, the gate of the fifth transistor and the gate of the sixth transistor are brought into a floating state depending on a potential of a gate of the first transistor, a potential of a gate of the second transistor and a potential of a gate of the third transistor.

13. The signal processing device according to claim 12, wherein the first transistor comprises a semiconductor layer, and
wherein the semiconductor layer comprises an oxide semiconductor.

14. The signal processing device according to claim 13, wherein the oxide semiconductor includes indium, gallium, and zinc.

15. The signal processing device according to claim 12, further comprising a multiplexer including a first input terminal, a second input terminal, and a third input terminal,
wherein one of the source and the drain of the fourth transistor is electrically connected to the first input terminal, wherein one of the source and the drain of the fifth transistor is electrically connected to the second input terminal, wherein one of the source and the drain of the sixth transistor is electrically connected to the third input terminal, and wherein a potential of the other of the source and the drain of the fourth transistor is equal to a potential of the other of the source and the drain of the fifth transistor and a potential of the other of the source and the drain of the sixth transistor.

\* \* \* \* \*